(12) United States Patent
Iwabuchi et al.

(10) Patent No.: US 10,610,906 B2
(45) Date of Patent: *Apr. 7, 2020

(54) METHOD FOR MANUFACTURING A RESIST COMPOSITION

(71) Applicant: SHIN-ETSU CHEMICAL CO., LTD., Tokyo (JP)

(72) Inventors: Motoaki Iwabuchi, Jyoetsu (JP); Tsutomu Ogihara, Jyoetsu (JP); Yukio Hoshi, Jyoetsu (JP); Yusuke Biyajima, Jyoetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 1013 days.

This patent is subject to a terminal disclaimer.

(21) Appl. No.: 14/456,323

(22) Filed: Aug. 11, 2014

(65) Prior Publication Data

US 2015/0099216 A1 Apr. 9, 2015

(30) Foreign Application Priority Data

Oct. 4, 2013 (JP) ................................. 2013-208915

(51) Int. Cl.
*B08B 9/02* (2006.01)
*G03F 7/26* (2006.01)
(Continued)

(52) U.S. Cl.
CPC .............. *B08B 9/032* (2013.01); *B01D 61/14* (2013.01); *B01D 61/145* (2013.01);
(Continued)

(58) Field of Classification Search
CPC ... G03F 7/0757; G03F 7/0755; C09D 183/04; C09D 183/06; C08L 83/04; C08G 77/04;
(Continued)

(56) References Cited

U.S. PATENT DOCUMENTS 4,770,977 A * 9/1988 Buiguez ................ G03F 7/0758
216/47
4,886,728 A * 12/1989 Salamy ................... G03F 7/162
427/240

(Continued)

FOREIGN PATENT DOCUMENTS

EP           1881371 A1    1/2008
JP       2004-053886 A    2/2004
(Continued)

OTHER PUBLICATIONS

Wu et al., Improving Advanced Lithography Process Defectivity with a Highly retentive 5nm Asymmetric UPE Filter, Entegris, INC., pp. 1-6 (2009).*

(Continued)

*Primary Examiner* — Amanda C. Walke
(74) *Attorney, Agent, or Firm* — Oliff PLC

(57) ABSTRACT

The present invention provides a method for manufacturing a resist composition which is used in a manufacturing process of a semiconductor apparatus, comprising the steps of:
 cleaning a manufacturing apparatus for the resist composition with a cleaning solution;
 analyzing the cleaning solution taken out from the manufacturing apparatus;
 repeating the step of cleaning and the step of analyzing until a concentration of a nonvolatile component(s) contained in the cleaning solution became 10 ppm or less; and
 manufacturing the resist composition by using the manufacturing apparatus after the step of repeating.
There can be provided a method for manufacturing a resist composition which can manufacture a resist composition lowered in coating defects.

3 Claims, 2 Drawing Sheets

(51) Int. Cl.
*B08B 9/032* (2006.01)
*G03F 7/16* (2006.01)
*G03F 7/09* (2006.01)
*G03F 7/075* (2006.01)
*B01D 61/14* (2006.01)
*B01D 61/18* (2006.01)
*B01D 61/22* (2006.01)
*G01N 5/04* (2006.01)
*C11D 11/00* (2006.01)
*B08B 3/04* (2006.01)
*B08B 3/08* (2006.01)

(52) U.S. Cl.
CPC .......... *B01D 61/147* (2013.01); *B01D 61/18* (2013.01); *B01D 61/22* (2013.01); *B08B 3/04* (2013.01); *B08B 3/08* (2013.01); *B08B 9/02* (2013.01); *C11D 11/0047* (2013.01); *G01N 5/04* (2013.01); *G03F 7/0752* (2013.01); *G03F 7/094* (2013.01); *G03F 7/16* (2013.01); *G03F 7/26* (2013.01)

(58) Field of Classification Search
CPC .... B01D 61/14; B01D 61/145; B01D 61/147; B01D 61/22; B01D 61/18
USPC ................ 430/270.1, 271.1, 272.1; 427/387; 428/447; 524/588, 860; 528/10, 25, 27, 528/31, 32, 43
See application file for complete search history.

(56) References Cited

U.S. PATENT DOCUMENTS

| | | | | |
|---|---|---|---|---|
| 5,151,219 | A * | 9/1992 | Salamy | G03F 7/162 252/364 |
| 5,278,626 | A * | 1/1994 | Poole | G01N 1/2813 356/335 |
| 5,685,327 | A * | 11/1997 | Mohindra | B08B 3/10 134/102.3 |
| 5,814,433 | A * | 9/1998 | Nelson | G03F 7/162 430/192 |
| 5,847,905 | A * | 12/1998 | Inaba | G11B 15/62 360/128 |
| 6,758,908 | B2 * | 7/2004 | Whitman | H01L 21/312 118/696 |
| 6,884,462 | B2 * | 4/2005 | Whitman | H01L 21/312 257/E21.259 |
| 7,275,550 | B2 * | 10/2007 | Nealon | B08B 9/00 134/22.1 |
| 8,048,615 | B2 * | 11/2011 | Takei | G03F 7/0752 430/272.1 |
| 8,557,759 | B2 * | 10/2013 | Jernigan | F25B 45/00 510/407 |
| 8,835,102 | B2 * | 9/2014 | Ogihara | C08L 83/04 430/322 |
| 8,906,452 | B1 * | 12/2014 | Hillman | G03F 7/162 118/320 |
| 9,207,535 | B2 * | 12/2015 | Ogihara | C09D 183/06 |
| 2001/0041769 | A1 * | 11/2001 | Iwasawa | C07F 7/0852 524/588 |
| 2006/0191854 | A1 * | 8/2006 | Sakillaris | G03F 7/0382 210/746 |
| 2007/0238300 | A1 | 10/2007 | Ogihara et al. | |
| 2008/0023046 | A1 * | 1/2008 | Restelli | B01D 29/01 134/33 |
| 2008/0153040 | A1 * | 6/2008 | Honda | G03F 7/423 430/319 |
| 2009/0253884 | A1 * | 10/2009 | Ogawa | C08G 77/06 528/10 |
| 2010/0167212 | A1 * | 7/2010 | Cho | G03F 7/11 430/313 |
| 2010/0297551 | A1 * | 11/2010 | Teranishi | C08F 220/18 430/270.1 |
| 2011/0177459 | A1 | 7/2011 | Ogihara et al. | |
| 2012/0129352 | A1 * | 5/2012 | Mori | B82Y 10/00 438/703 |
| 2013/0108957 | A1 | 5/2013 | Iwabuchi et al. | |
| 2013/0108958 | A1 | 5/2013 | Ogihara et al. | |
| 2013/0224957 | A1 | 8/2013 | Kanno et al. | |
| 2014/0054738 | A1 * | 2/2014 | Yamamoto | C09D 183/04 257/432 |
| 2014/0148536 | A1 * | 5/2014 | Kawabata | C07F 7/21 524/101 |
| 2014/0335453 | A1 * | 11/2014 | Ogihara | C08L 83/04 430/270.1 |
| 2014/0338704 | A1 * | 11/2014 | Juliette | B08B 9/08 134/22.1 |
| 2015/0166941 | A1 * | 6/2015 | Sassa | C11D 11/0047 438/778 |
| 2015/0286143 | A1 * | 10/2015 | Ogihara | H01L 21/30604 438/703 |
| 2016/0320275 | A1 * | 11/2016 | Kreszowski | C01B 33/037 |
| 2018/0102242 | A1 * | 4/2018 | Choong | H01J 49/0031 |

FOREIGN PATENT DOCUMENTS

| | | | |
|---|---|---|---|
| JP | 2004053888 A | * | 2/2004 |
| JP | 2007072138 A | * | 3/2007 |
| JP | B2-4716037 | | 7/2011 |
| JP | 2013-088711 A | | 5/2013 |
| JP | 2013-112705 A | | 6/2013 |
| JP | 2018163011 A | * | 10/2018 |
| WO | 2012/053600 A1 | | 4/2012 |

OTHER PUBLICATIONS

Machine translation of JP 2004-053888 (no date).*
Machine translation of JP 2007-072138 (no date).*
Mar. 6, 2015 Extended Search Report issued in European Application No. 14003162.6.
Sep. 20, 2017 Office Action issued in Korean Application No. 10-2014-0121844.
Aug. 2, 2016 Office Action issued in Japanese Patent Application No. 2013-208915.
Feb. 28, 2017 Office Action issued in Japanese Application No. 2013-208915.
Mar. 10, 2017 Office Action issued in Korean Patent Application No. 10-2014-0121844.

* cited by examiner

METHOD FOR MANUFACTURING A RESIST COMPOSITION

BACKGROUND OF THE INVENTION

Field of the Invention

The present invention relates to a method for manufacturing a resist composition to be used in fine processing in a process for manufacturing a semiconductor apparatus including a semiconductor device, etc., in particular, a composition for a resist film to be used in the multilayer resist method.

Description of the Related Art

Accompanying with high integration and high speed acceleration of an LSI, miniaturization of a circuit pattern size is rapidly progressing. The lithography technology has achieved formation of a fine pattern by shortening wavelength of the light source and selecting an appropriate resist composition thereto, which are to conform to the miniaturization.

However, in the case where miniaturization is performed with the same light source, when the miniaturization is performed with the same film thickness of the photoresist film to be used, i.e., when a pattern width is made smaller, the aspect ratio of the photoresist pattern after development becomes large, and pattern collapse occurs as a result. Thus, the photoresist film thickness has been thinned accompanied by the miniaturization so that the aspect ratio of the photoresist pattern is in an appropriate range. However, due to thinning of the photoresist film, the problem further generated that precision of pattern transfer to a substrate to be processed is lowered.

As one of the methods to solve the above-mentioned problems, there is a multilayer resist method. In this method, an under layer film having etching selectivity different from that of a photoresist film, i.e., a resist upper layer film, is interposed between the resist upper layer film and a substrate to be processed, then a pattern is formed at the resist upper layer film, then the pattern is transferred to the under layer film by etching using the upper layer resist pattern as an etching mask, and further the pattern is transferred to the substrate to be processed by etching using the under layer film as an etching mask.

As the resist under layer film used in the multilayer resist method, a silicon-containing resist under layer film has been used in recent years (Patent Document 1). This silicon-containing resist under layer film is easy in forming a film, and has an etching selectivity different from that of an upper layer resist, so that it is excellent in processing performance. On the other hand, a composition for forming the silicon-containing resist under layer film is different from an organic film material which does not contain silicon such as the conventional photoresist material, etc., and once it begins condensation of the polymer and becomes a higher molecular weight polymer in a pipe or in a filter, a solvent-insoluble deposit is generated. This is a property of a silicon-containing polymer contained in the composition for forming the silicon-containing resist under layer film. The deposit of the polymer is in generally called as a siloxane gel, a size of which is extremely small, so that it passes even a filter having a pore size of 20 nm or so, which is connected to a discharge pipe of a coating apparatus for forming a silicon-containing film, and observed as defects in a silicon-containing coating film formed on a substrate for manufacturing a semiconductor apparatus.

The defects in the coating film are minute unevenness generated when a resist composition is coated on a substrate for manufacturing a semiconductor apparatus, and defects contained in the resist film, in particular, in the silicon-containing resist under layer film, affect the pattern of the resist upper layer film, which cause pattern defects in many cases. When the pattern defects are transferred to the substrate to be processed for a semiconductor apparatus by dry etching, the manufactured semiconductor apparatus shows electrical abnormality such as open abnormality, short-circuit abnormality, etc., in the circuit, which is one of the reasons in lowering yield of the semiconductor apparatus. At present, the method for effectively removing the siloxane gel generated in a pipe or in a filter is limited only to filtrate the gel using a filter, which is not sufficient for removing particularly small defects, so that an effective means is being required.

PRIOR ART DOCUMENT

Patent Document

Patent Document 1: Japanese Patent No. 4716037

SUMMARY OF THE INVENTION

The present invention has been done to solve the above-mentioned problems, and has an object to provide a method for manufacturing a resist composition which can manufacture a resist composition lowered in coating defects.

To solve the above-mentioned problems, the present invention provides a method for manufacturing a resist composition which is used in a manufacturing process of a semiconductor apparatus, comprising the steps of:

cleaning a manufacturing apparatus for the resist composition with a cleaning solution;

analyzing the cleaning solution taken out from the manufacturing apparatus;

repeating the step of cleaning and the step of analyzing until a concentration of a nonvolatile component(s) contained in the cleaning solution became 10 ppm or less; and manufacturing the resist composition by using the manufacturing apparatus after the step of repeating.

When a method for manufacturing a resist composition wherein the manufacturing apparatus for the resist composition is cleaned until an amount of a nonvolatile component(s) in the cleaning solution used for cleaning becomes a certain amount or lower is employed, the resist composition lowered in coating defects can be manufactured. Also, the resist composition thus manufactured has been lowered in coating defects so that it can be suitably used for liquid immersion exposure, double patterning, organic solvent development, etc.

At this time, it is preferred that the above-mentioned nonvolatile component(s) is/are a component(s) derived from a material(s) other than the solvent(s) used in the resist composition.

In the method for manufacturing a resist composition of the present invention, a resist composition lowered in coating defects can be obtained particularly by cleaning the manufacturing apparatus until such a component(s) in the cleaning solution becomes a certain amount or lower.

Also, in the analysis of the cleaning solution, it is preferred to calculate the concentration of the nonvolatile component(s) by using any of an inductively coupled plasma mass spectrometer, an inductively coupled plasma atomic emission spectrometer and an atomic absorption spectrometer.

When the cleaning solution is analyzed by using such an apparatus, the concentration of the nonvolatile component(s) in the cleaning solution can be accurately calculated.

At this time, the cleaning solution is taken out from the manufacturing apparatus, the cleaning solution is evaporated to dryness, and a solution in which the residue of the cleaning solution is dissolved again in a solvent to be used for analysis can be used for calculating the concentration of the nonvolatile component(s).

When such a method is employed, the concentration of the nonvolatile component(s) in the cleaning solution can be calculated with better sensitivity and more accurately.

It is also preferred that a material containing silicon is used as the resist composition.

The method for manufacturing a resist composition of the present invention can be suitably used for the manufacture of a resist composition containing silicon, which easily becomes a higher molecular weight polymer.

When the method for manufacturing a resist composition according to the present invention is employed, a resist composition lowered in coating defects can be manufactured. The resist composition thus manufactured, in particular, a composition for forming a silicon-containing resist under layer film can suppress generation of coating defects generated when the composition is coated on a substrate for manufacturing a semiconductor apparatus. Accordingly, when the formed upper layer photoresist pattern is transferred to a silicon-containing resist under layer film and then to an organic under layer film using a dry etching process, pattern transfer without defects can be realized. Therefore, it can be suitably used particularly for liquid immersion exposure, double patterning, organic solvent development, etc., in the multilayer resist method, and finally the yield in manufacturing the semiconductor apparatus can be improved.

DETAILED DESCRIPTION OF THE PREFERRED EMBODIMENTS

Figure 1:
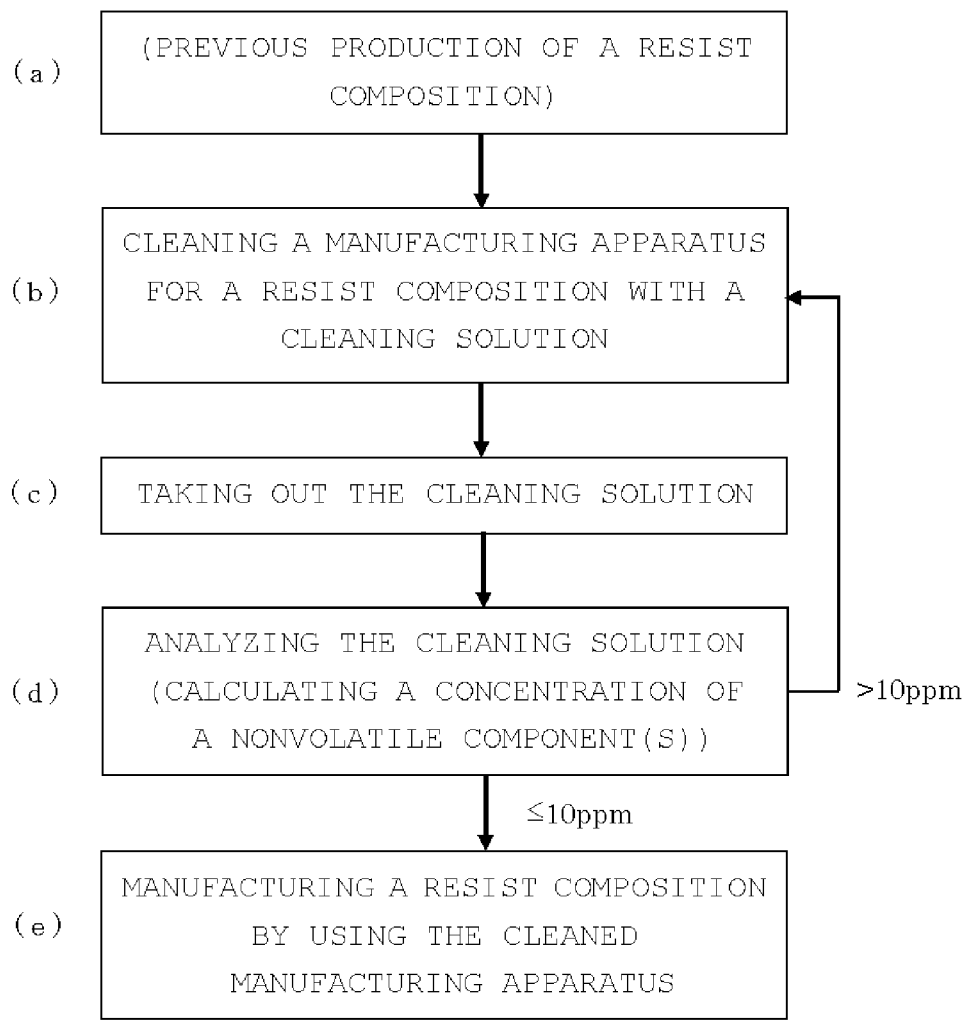
FIG. 1 is a flow chart of a method for manufacturing a resist composition of the present invention.

Lithography characteristics or stability of a composition for forming a silicon-containing resist under layer film to be used in the multilayer resist method have been investigated until now, and a composition for forming a silicon-containing resist under layer film as disclosed in Japanese Patent No. 4716037, etc., has been provided. However, as mentioned above, miniaturization of a circuit pattern of a semiconductor apparatus has further proceeded, and miniaturization of an upper layer resist pattern is also progressing, whereby a coating film with low defects than those of the conventional materials has been demanded as characteristics required for the silicon-containing resist under layer film provided by spin coating.

In general, when a resist composition containing silicon is to be manufactured continuously, polysiloxane remained in a preparation tank or a pipe (hereinafter referred to as "manufacture apparatus") at the time of completion of the manufacture becomes a higher molecular weight polymer and then change to an insoluble polysiloxane gel in the manufacturing apparatus until the next manufacturing process starts. When starting materials are supplied into the manufacturing apparatus at the time of the next manufacturing process of the resist composition, the polysiloxane gel is mixed with the starting materials, whereby it becomes a main cause of generating coating defects. Thus, the present inventors have found that if a resist composition is manufactured in a manufacturing apparatus with a less amount of the polysiloxane gel, mixing of the insoluble polysiloxane gel in the manufacturing apparatus can be suppressed, whereby a resist film with less coating defects can be formed.

The present inventors have earnestly investigated to lower such defects, and they have found that a method in which a cleaning solution conventionally used for cleaning a manufacturing apparatus which has been used for manufacturing the composition for forming a silicon-containing resist under layer film is analyzed, a concentration of the nonvolatile component(s) such as a polysiloxane and a polysiloxane gel, etc., in the cleaning solution is calculated, and the manufacturing apparatus is cleaned until an amount of the nonvolatile component(s) in the cleaning solution becomes a certain amount or less, becomes a method for manufacturing a resist composition capable of forming a coating film with a less defect stably, whereby they have accomplished the present invention.

That is, the present invention provides a method for manufacturing a resist composition which is used in a manufacturing process of a semiconductor apparatus, comprising the steps of:

cleaning a manufacturing apparatus for the resist composition with a cleaning solution;

analyzing the cleaning solution taken out from the manufacturing apparatus;

repeating the step of cleaning and the step of analyzing until a concentration of a nonvolatile component(s) contained in the cleaning solution became 10 ppm or less; and manufacturing the resist composition by using the manufacturing apparatus after the step of repeating.

In the following, the present invention is explained by referring to the drawings.

Incidentally, in the following explanation, as a preferred example, a resist composition containing silicon, i.e., the case where a composition for forming a silicon-containing film is manufactured is exemplified, but the present invention is not limited by these.

FIG. 1 is a flow chart of a method for manufacturing a resist composition of the present invention.

Figure 2:
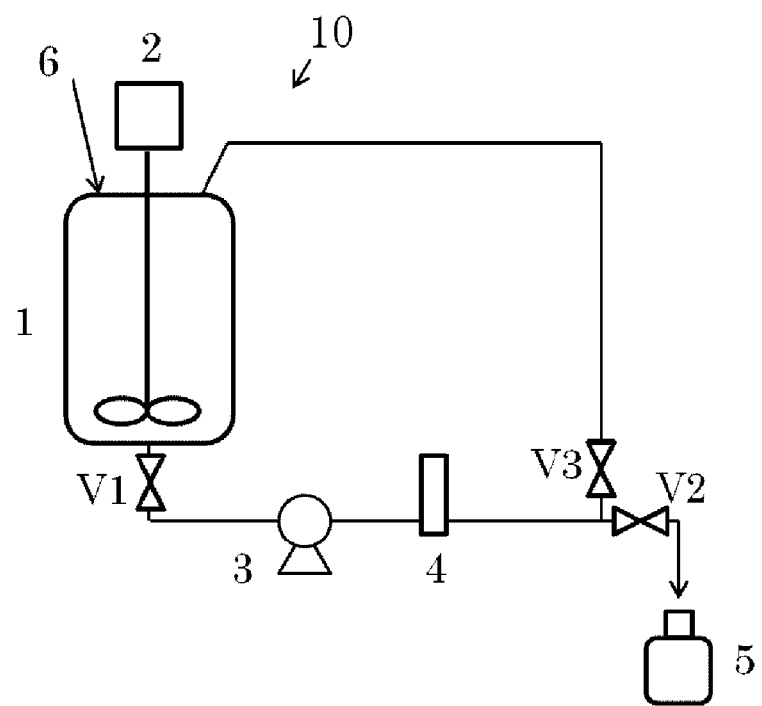
FIG. 2 is a schematic drawing showing an example of a manufacturing apparatus for the resist composition used in the present invention.

First, in the process (a), manufacture of a composition for forming a silicon-containing film is previously carried out by a manufacturing apparatus 10 as shown in FIG. 2.

The manufacturing apparatus 10 comprises a preparation tank 1 equipped with a stirrer 2 and a feeding port 6; a liquid feeding pump 3 connecting thereto from the preparation tank 1 through a pipe having a tank valve V1; a filtering machine 4 filtrating the cleaning solution or a composition for forming a silicon-containing film sent out from the liquid feeding pump 3; and a draw-off valve V2 for feeding the composition for forming a silicon-containing film filtrated by the filtering machine 4 to a product container 5, and further a circulation valve V3 for circulating a cleaning solution fed from the feeding port 6 of the preparation tank 1 at the time of cleaning and a pipe for feeding the cleaning solution. Specifically, at the filtering machine 4, a filter for manufacturing mentioned later may be installed for the purpose of removing alien substances, or a filter for manufacturing and a filter for cleaning may be different.

In the manufacturing apparatus 10 after manufacturing a composition for forming a silicon-containing film in advance in the process (a), a polysiloxane remained in the preparation tank 1 or a pipe(s) connecting the respective equipment during the time from the previous manufacturing to the present manufacturing is dried and higher polymerized, which became a polysiloxane gel and remains. This polysiloxane gel acts on a polysiloxane which is a starting material of a composition for forming a silicon-containing film and newly supplied at the time of the next manufacturing to promote higher polymerization of the polysiloxane, and accelerate generation of a polysiloxane gel which is a cause of the coating defects.

Next, in the process (b), cleaning of the manufacturing apparatus 10 is carried out with a cleaning solution. According to this procedure, the cause of the coating defects such as a polysiloxane, etc., in the preparation tank 1 or in the respective pipes is cleaned and removed. Incidentally, at the step of the process (b), it is preferred that a filter for manufacturing mentioned later may be installed at the filtering machine 4 for the purpose of heightening degree of cleanliness, or the filter for manufacturing used in the process (a) is changed to other filter.

As the cleaning solution, a material containing one or more selected from the group consisting of water, an organic solvent, an acidic solvent and a basic solvent is preferably used, in particular, water solely, or a cleaning solution containing an organic solvent is frequently used.

The organic solvent may be exemplified by, for example, an alcohol such as methanol, ethanol, propanol, butanol, methoxyethanol, butoxyethanol, methoxypropanol, ethoxypropanol, etc., a ketone such as acetone, methyl ethyl ketone, cyclohexanone, etc., an ether such as tetrahydrofuran, dioxane, ethylene glycol dimethyl ether, diethylene glycol dimethyl ether, propylene glycol ethyl ether, etc., an ester such as ethyl acetate, butyl acetate, ethyl lactate, ethyl cellosolve acetate, propylene glycol methyl ether acetate, γ-butyrolactone, etc., an aromatic compound such as benzene, toluene, xylene, etc., a chlorinated hydrocarbon such as dichloromethane, dichloroethane, dichloroethylene, trichloroethylene, etc., and preferably an alcohol such as methanol, ethanol, propanol, butanol, methoxyethanol, butoxyethanol, methoxypropanol, ethoxypropanol, etc., a ketone such as acetone, methyl ethyl ketone, cyclohexanone, etc., an ether such as tetrahydrofuran, dioxane, ethylene glycol dimethyl ether, diethylene glycol dimethyl ether, propylene glycol ethyl ether, etc., an ester such as ethyl acetate, butyl acetate, ethyl lactate, ethyl cellosolve acetate, propylene glycol methyl ether acetate, γ-butyrolactone, etc.

Also, a material in which water is contained in the above-mentioned organic solvent may be used as a cleaning solution. When water is contained therein, cleaning of a water-soluble nonvolatile component(s) which is/are difficultly removed by cleaning with an organic solvent alone, a polysiloxane and a polysiloxane gel can be promoted.

Further, a volatile acid, a base and/or a surfactant may be added to a cleaning solution comprising any of an organic solvent, a mixed solvent of an organic solvent and water, or water as an additive. By adding such an additive, a solid material (including nonvolatile component(s)) which cannot be removed only by an organic solvent or water is peeled off from the surface of the apparatus such as the manufacturing apparatus, etc., whereby cleaning can be promoted.

Next, in the process (c), the cleaning solution is taken out from the manufacturing apparatus 10.

As a method for taking out the cleaning solution from a manufacturing apparatus 10 shown in FIG. 2, there may be exemplified by the method in which the cleaning solution is drawn off by opening the draw-off valve V2, or the cleaning solution is collected from the feeding port 6 of the preparation tank 1.

Next, in the process (d), the cleaning solution taken out is analyzed and a concentration of the nonvolatile component(s) is calculated.

The nonvolatile component(s) is a material contained in the cleaning solution which was used for cleaning the manufacturing apparatus for the resist composition, and preferably a component(s) derived from a material(s) other than the solvent (a solvent dissolving a resist composition) used in the resist composition. Such a material may be mentioned those derived from the respective equipment of the manufacturing apparatus, a monomer of the resist composition remained in the apparatus at the previous manufacturing, and a polymer (gel) in which these are higher polymerized. In particular, when a composition for forming a silicon-containing film is to be manufactured as the resist composition, the component(s) containing silicon (Si) such as a polysiloxane and a polysiloxane gel, etc., is/are the main nonvolatile component(s). Incidentally, the solvent used in the resist composition may be generally exemplified by a solvent to be used for manufacturing and/or dissolving the resist composition, in particular, a solvent containing at least one selected from the group consisting of water, an organic solvent, an acidic solvent and a basic solvent can be exemplified.

At this time, the less concentration of the nonvolatile component(s) in the cleaning solution used for cleaning the manufacturing apparatus shows the higher degree of cleanliness, but it is actually extremely difficult to make the concentration thereof zero, so that it is substantially 10 ppm or less, preferably 1 ppm or less. If it is 10 ppm or less, a resist composition lowered in coating defects than the conventional ones can be obtained.

For calculating the concentration of the nonvolatile component(s), a method (evaporation drying method) in which the cleaning solution after cleaning is dried, and the remaining nonvolatile component(s) is weighed to calculate the amount has generally been used. However, when the required degree of cleanliness is high, for weighing an extremely minute amount of the nonvolatile component(s), an amount of the cleaning solution to be dried must be made much and the amount of the residue must be weighed by using a high precision weighing machine in the above-mentioned method. For example, an amount of the nonvolatile component(s) in 100 g of the cleaning solution containing 10 ppm of the nonvolatile component(s) is 0.001 g, and the value is difficultly weighed so that in the region of 10 ppm or less, sufficient precision can be difficultly obtained. In addition, a method of detecting the concentration by spectrophotometry or measuring a refractive index has been used, but when the concentration of the nonvolatile component(s) is 10 ppm or less, a calibration curve with high reliability can be difficultly obtained. Further, a method of calculating the amount by RI detection in GPC has been used, but this method does not so have a high detection sensitivity, so that when the required cleaning degree is high, a large amount of the cleaning solution to be analyzed must be prepared.

From the reasons as mentioned above, in the present invention, for analyzing the cleaning solution, it is preferred to calculate the concentration of the nonvolatile component(s) by using any of an inductively coupled plasma mass spectrometer (ICP-MS), an inductively coupled plasma atomic emission spectrometer (ICP-AES), and an atomic absorption spectrometer (AAS) as a detector. When any of the ICP-MS, ICP-AES or AAS is used as a detector, the precision is 0.1 ppb which can be calculated precisely, whereby these can be suitably used as a method for confirming the degree of cleanliness in the analysis of the cleaning solution in the present invention.

Also, in the above-mentioned analysis of the cleaning solution, it is preferred that a solution in which the cleaning solution taken out from the manufacturing apparatus is evaporated to dryness and the residue of the cleaning solution is again dissolved in a solvent to be used for analysis is used for calculating the concentration of the nonvolatile component(s). When such a solution is used for calculating the concentration of the nonvolatile component(s), if ICP-MS, ICP-AES or AAS is used as a detector, effects of impurities other than the nonvolatile component(s) (volatile component(s), etc.) can be suppressed, whereby the concentration of the nonvolatile component(s) can be calculated more accurately.

At this time, the solvent to be used for analysis may be exemplified by a material containing at least one selected from the group consisting of water, an organic solvent, an acidic solvent and a basic solvent. The solvent to be used for analysis is preferably a material which can dissolve the residue obtained by subjecting the cleaning solution to evaporated to dryness, i.e., the residue comprising the non-volatile component(s), and in particular, when a composition for forming a silicon-containing film is to be manufactured as the resist composition, a material containing an acidic solvent such as hydrofluoric acid, etc., or a basic solvent is preferred in the point of dissolving a siloxane or a siloxane gel as the nonvolatile component(s).

When the concentration of the nonvolatile component(s) calculated in the process (d) is greater than 10 ppm (>10 ppm), cleaning with the cleaning solution of the process (b), taking out the cleaning solution of the process (c), and analyzing the cleaning solution (calculating the concentration of the nonvolatile component(s)) of the process (d) are performed again. The above-mentioned processes are repeated until the concentration of the nonvolatile component(s) becomes 10 ppm or less. When the concentration of the nonvolatile component(s) is 10 ppm or less (≤10 ppm), the method can proceed to the next process (e).

In the process (e), manufacture of a composition for forming a silicon-containing film (resist composition) is performed in the manufacturing apparatus thus cleaned.

Starting materials of the composition for forming a silicon-containing film are fed to the preparation tank 1 from the feeding port 6, mixed, uniformized, and prepared. The starting materials of the composition for forming a silicon-containing film may be specifically exemplified by those as disclosed in Japanese Patent No. 4716037, etc.

The prepared composition for forming a silicon-containing film is filtered to remove an alien substance(s) by passing through the filtering machine 4 at which a filter has been installed.

A pore size of the filter for manufacturing may be optionally selected depending on the degree of cleanliness required for the product (resist composition). For example, when the concentration of the nonvolatile component(s) is to be made 10 ppm or less, those having a pore size of 20 nm or less may be used, and when a further higher degree of cleanliness of 1 ppm or less, etc., is required, those having a pore size of 10 nm or less may be used.

The material of the filter for manufacturing may be mentioned by a material comprising a fluorocarbon, a cellulose, nylon, a polyester, a hydrocarbon, etc., and in the filtering process of the resist composition, a filter formed by a fluorocarbon such as the so-called Teflon (registered trademark), a hydrocarbon such as a polyethylene and a polypropylene, etc., and nylon has preferably been used.

Thereafter, the draw-off valve V2 is opened to feed the prepared and filtered composition for forming a silicon-containing film to the product container 5 to complete the manufacturing process of the composition for forming a silicon-containing film. Incidentally, the degree of cleanliness of the composition for forming a silicon-containing film may be inspected before it is fed to the product container 5, if necessary.

In the above descriptions, the case where a composition for forming a silicon-containing film is manufactured is explained as a preferred example, but the resist composition to be manufactured by the present invention is not particularly limited, and can be applied to any of the resist compositions, in particular, so long as it is a resist composition to be used in the multilayer resist method.

When such a method for manufacturing the resist composition is employed, the degree of cleanliness in the manufacturing apparatus can be accurately measured than those of the conventional methods, and by cleaning the manufacturing apparatus until an amount of the nonvolatile component(s) in the cleaning solution becomes a certain amount or less, the residue in the manufacturing apparatus remained by the previous manufacturing process can be certainly cleaned and removed, whereby a resist composition lowered in coating defects can be manufactured. In addition, the thus manufactured resist composition has been lowered in coating defects, so that it can be suitably used for liquid immersion exposure, double patterning, organic solvent development, etc., and further, yield in manufacturing a semiconductor apparatus can be improved.

EXAMPLES

In the following, the present invention is explained in more detail by referring to Examples and Comparative Example, but the present invention is not limited by these descriptions.

Example 1

A composition for forming a silicon-containing resist under layer film was manufactured by using the manufacturing apparatus shown in FIG. 2. A filter cartridge made of a polyethylene and has a pore size of 20 nm was set to a filtering machine 4, and then, 20 L of propylene glycol methyl ether acetate (in the following, it is abbreviated to as PGMEA) was fed from a feeding port 6 of 100 L of a preparation tank 1 as a cleaning solution. The solution was stirred by a stirrer 2 for 1 hour, then, the stirrer 2 was stopped, a tank valve V1 and a circulation valve V3 were opened and a draw-off valve V2 was closed, and a liquid feeding pump 3 was started to circulate PGMEA for 24 hours. This PGMEA was discharged from the apparatus by opening the draw-off valve V2. The same operation was repeated once again, and the PGMEA was captured by a clean glass bottle when it is discharged out of the apparatus. This PGMEA was spin coated on a silicon wafer by using Clean Track ACT12 manufactured by Tokyo Electron Limited with 1500 rpm, and the wafer was dried by spin drying. The surface defects of the wafer were measured by a dark field defect inspection apparatus SP-2 manufactured by KLA-Tencor Corporation and a number of coating defects of 100 nm or more was measured (a number of defects on the wafer). A concentration of the silicon-containing organic resin in the same solution (PGMEA) was also measured by using ICP-MS, ICP-AES, AAS and GPC as a detector. As ICP-MS, 7700s manufactured by Agilent Technologies, Inc. was used, as ICP-AES, VISTA-PRO manufactured by Agilent Technologies, Inc. (former Varian Inc.) was used, as AAS, contrAA manufactured by Analytik Jena AG was used to measure an amount of Si, and an amount of the polysiloxane was calculated as a concentration of the nonvolatile component(s). As GPC, Type GPC-8220 manufactured by Tosoh Corporation was used, a concentration of the polysiloxane was measured from a calibration curve by a refractometer and an amount of the polysiloxane was calculated as a concentration of the nonvolatile component(s).

Example 2

Cleaning was performed by the same manner as in Example 1, except for changing the pore size of the filter cartridge made of a polyethylene to be set to the filtering machine 4 to 10 nm, and a number of the surface defects of the cleaning solution was measured by SP-2 as a number of coating defects of 80 nm or more. With regard to the same solution, a concentration of the nonvolatile component(s) was calculated by the same method as in Example 1.

Example 3

Cleaning was performed by the same manner as in Example 1, except for changing the pore size of the filter cartridge made of a polyethylene to be set to the filtering machine 4 to 3 nm, and a number of the surface defects of the cleaning solution was measured by SP-2 as a number of coating defects of 60 nm or more. With regard to the same solution, a concentration of the nonvolatile component(s) was calculated by the same method as in Example 1.

Example 4

Cleaning was performed by the same manner as in Example 3, except for changing the cleaning solution to propylene glycol ethyl ether (in the following, it is abbreviated to as PGEE), and a number of the surface defects of the cleaning solution was measured by SP-2 as a number of coating defects of 60 nm or more. With regard to the same solution, a concentration of the nonvolatile component(s) was calculated by the same method as in Example 1.

Comparative Example 1

By using the following mentioned manufacturing apparatus, a composition for forming a silicon-containing resist under layer film was manufactured. 20 L of PGMEA was fed from a feeding port 6 of 100 L of a preparation tank 1 without setting the filter cartridge to the filtering machine 4. The solution was stirred by a stirrer 2 for 1 hour, then, the stirrer 2 was stopped, a tank valve V1 and a circulation valve V3 were opened and a draw-off valve V2 was closed, and a liquid feeding pump 3 was started to circulate PGMEA for 24 hours. This PGMEA was discharged from the apparatus by opening the draw-off valve V2 and captured by a clean glass bottle. This PGMEA was spin coated on a silicon wafer by using ACT12 with 1500 rpm, and the wafer was dried by spin drying. The surface defects of the wafer were measured by SP-2 as a number of coating defects of 100 nm or more. With regard to the same solution, a concentration of the nonvolatile component(s) was calculated by the same method as in Example 1.

Next, to the respective manufacturing apparatuses 10 cleaned in Examples 1 to 4 and Comparative Example 1 were added 16 kg of a PGEE solution containing 10% by weight of a polysiloxane having the composition shown below, 64 kg of PGEE and 8 kg of deionized water. The solution was stirred for 1 hour, then, the stirrer 2 was stopped, the tank valve V1 and the circulation valve V3 were opened and the draw-off valve V2 was closed, and the liquid feeding pump 3 was started to perform circulation filtration for 176 hours with a flow rate of 10 kg per hour. The prepared silicon-containing resist under layer film composition was filled in a clean glass bottle by opening the draw-off valve V2. The respective silicon-containing resist under layer film compositions obtained by the respective manufacturing apparatuses of Examples 1 to 4 and Comparative Example 1 were each spin coated on a silicon wafer by using ACT12 with 1500 rpm, and baked at 240° C. for 60 seconds to obtain respective silicon-containing resist under layer films each with a thickness of 35 nm. The surface defects of the coating film were measured as a number of coating defects of 60 nm or more by SP-2 (coating film defects).

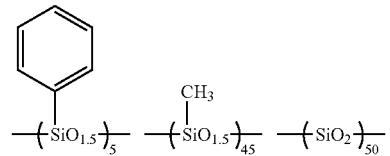

Patterning Test by Positive Development

On a silicon wafer, a spin-on carbon film ODL-50 (carbon content: 80% by mass) available from Shin-Etsu Chemical Co., Ltd., was formed with a film thickness of 200 nm. The compositions for forming a silicon-containing resist under layer film obtained by the manufacturing apparatus of Examples 1 to 4 and Comparative Example 1 were each coated thereon and baked at 240° C. for 60 seconds to prepare each of the coating film with a film thickness of 35 nm. Subsequently, the ArF resist solution for positive development (PR-1) described in Table 1 was coated, and baked at 110° C. for 60 seconds to form a photoresist layer with a film thickness of 100 nm. Further, the liquid immersion top coat (TC-1) described in Table 2 was coated on the photoresist film and baked at 90° C. for 60 seconds to form a top coat with a film thickness of 50 nm.

Next, these were exposed by an ArF liquid immersion exposure apparatus (NSR-S610C manufactured by Nikon Corporation, NA: 1.30, σ: 0.98/0.65, 35° polarized dipole illumination, 6% halftone phase shift mask), baked at 100° C. for 60 seconds (PEB), and developed by a 2.38% by mass tetramethylammonium hydroxide (TMAH) aqueous solution for 30 seconds to obtain 43 nm 1:1 positive line and space pattern.

Pattern defects of the respective patterns were observed by a bright-field defect inspection device KLA2800 manufactured by KLA-Tencor Corporation. The results are shown in Table 3 (pattern defects).

TABLE 1

| No. | Polymer (parts by mass) | Acid generator (parts by mass) | Base (parts by mass) | Solvent (parts by mass) |
| --- | --- | --- | --- | --- |
| PR-1 | ArF resist polymer 1 (100) | PAG1 (7.0) | Quencher (1.0) | PGMEA (2,500) |

ArF resist polymer 1:
Molecular weight (Mw) = 7,800
Dispersity (Mw/Mn) = 1.78

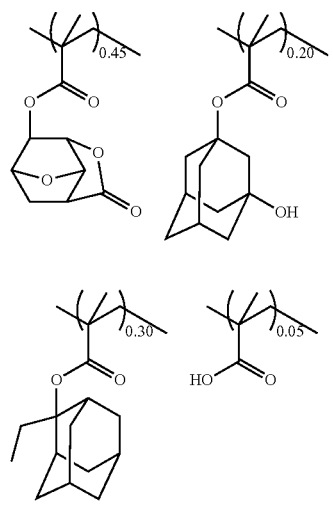

TABLE 1-continued

| No. | Polymer (parts by mass) | Acid generator (parts by mass) | Base (parts by mass) | Solvent (parts by mass) |
| --- | --- | --- | --- | --- |

Acid generator: PAG1

Base: Quencher

TABLE 2

| Polymer (parts by mass) | Organic solvent (parts by mass) |
| --- | --- |
| TC-1 Top coat polymer (100) | diisoamyl ether (2700) 2-methyl-1-butanol (270) |

Top coat polymer:
Molecular weight (Mw) = 8,800
Dispersity (Mw/Mn) = 1.69

Test results of a degree of cleanliness of the cleaning solution, a concentration of the nonvolatile component(s), coating film defects, and pattern defects detected by the respective detecting methods of the above-mentioned Examples 1 to 4 and Comparative Example 1 were summarized in the following Table 3.

TABLE 3

| Detector | Degree of cleanliness of cleaning solution (Number of defects on wafer) | Nonvolatile component(s) (calculated from Si amount) | | | | Coating film defects | Pattern defects |
| --- | --- | --- | --- | --- | --- | --- | --- |
| | | ICP-MS | ICP-AES | AAS | GPC | | |
| Example 1 | 80 | 2.5 ppm | 3.6 ppm | 3.1 ppm | 10 ppm or less | 20 | 10 |
| Example 2 | 90 | 1.8 ppm | 2.8 ppm | 2.6 ppm | 10 ppm or less | 10 | 5 |
| Example 3 | 40 | 0.6 ppm | 1.1 ppm | 0.5 ppm | 10 ppm or less | 5 | 3 |
| Example 4 | 40 | 0.3 ppm | 0.6 ppm | 0.2 ppm | 10 ppm or less | 5 | 2 |
| Comparative Example 1 | 160 | 122.5 ppm | 216 ppm | 166 ppm | 89 ppm | 160 | 50 |

In Examples 1 to 4, the concentrations of the nonvolatile component(s) calculated by using ICP-MS, ICP-AES, AAS and GPC were each 10 ppm or less, so that coating film defects were lowered when the resist compositions manufactured were coated, and pattern defects were lowered when the resist compositions manufactured were used in the patterning process. On the other hand, in Comparative Example 1, the concentrations of the nonvolatile component(s) calculated by using ICP-MS, ICP-AES, AAS and GPC were the values greater than 10 ppm, so that coating film defects or pattern defects were values remarkably greater than those of Examples 1 to 4.

From the results as mentioned above, it could be clarified that according to the method for manufacturing a resist composition of the present invention, a degree of cleanliness in the manufacturing apparatus can be accurately measured than the conventional methods, and a resist composition lowered in defects derived from coating defects such as coating film defects and pattern defects can be manufactured.

It should be noted that the present invention is not limited to the above-described embodiments. The above-described embodiments are described for illustrative purposes, and those having substantially the same configuration and those providing the same operational advantage as the technical concept described in the claims of the present invention are all encompassed in the technical scope of the present invention.

What is claimed is:

1. A method for cleaning a manufacturing apparatus for a silicon-containing resist under layer film-forming composition, which is used in a manufacturing process of a semiconductor apparatus, comprising the steps of:

cleaning the manufacturing apparatus, including a preparation tank and a pipe, for the silicon-containing resist under layer film-forming composition with a cleaning solution;

analyzing the cleaning solution taken out from the manufacturing apparatus;

repeating the step of cleaning and the step of analyzing until a concentration of a nonvolatile component(s) contained in the cleaning solution becomes 10 ppm or less, wherein the concentration of the nonvolatile component(s) is calculated by using any of an inductively coupled plasma mass spectrometer, an inductively coupled plasma atomic emission spectrometer and an atomic absorption spectrometer in analyzing the cleaning solution, and wherein the cleaning solution is taken out from the manufacturing apparatus, the cleaning solution is evaporated to dryness, and a solution in which a residue of the cleaning solution is dissolved again in a solvent to be used for analysis is used for calculating the concentration of the nonvolatile component(s).

2. The method for cleaning according to claim 1, wherein the nonvolatile component(s) is/are a component(s) derived from a material(s) other than a solvent(s) used in the silicon-containing resist under layer film-forming composition.

3. The method for cleaning according to claim 1, comprising repeating the step of cleaning and the step of analyzing until a concentration of a nonvolatile component(s) contained in the cleaning solution becomes 1 ppm or less.

* * * * *